United States Patent [19]

Le Roux

[11] Patent Number: 5,007,426
[45] Date of Patent: Apr. 16, 1991

[54] METHOD FOR DEPICTION OF MOVING PARTS IN A BODY BY NUCLEAR MAGNETIC RESONANCE EXPERIMENT

[75] Inventor: Patrick Le Roux, Gif sur Yvette, France

[73] Assignee: General Electric CGR S.A., Issy les Moulineaux, France

[21] Appl. No.: 246,666

[22] PCT Filed: Nov. 13, 1987

[86] PCT No.: PCT/FR87/00450
§ 371 Date: Jul. 18, 1988
§ 102(e) Date: Jul. 18, 1988

[87] PCT Pub. No.: WO88/04046
PCT Pub. Date: Jun. 2, 1988

[30] Foreign Application Priority Data
Nov. 21, 1986 [FR] France .................. 86 16259

[51] Int. Cl.$^5$ .................... A61B 5/055
[52] U.S. Cl. .................... 128/653 OAF; 324/306; 324/309
[58] Field of Search ............. 128/653; 324/306, 307, 324/309, 313, 314, 320

[56] References Cited
U.S. PATENT DOCUMENTS
4,697,149 9/1987 Moran .................. 324/309
4,718,424 1/1988 Nishimura .............. 128/653
4,777,956 10/1988 Macovski .............. 128/653

FOREIGN PATENT DOCUMENTS
0152879 8/1985 European Pat. Off. .

OTHER PUBLICATIONS
IEEE Transactions on Medical Imaging, vol. MI-5, No. 3, Sep. 1986 (New York, U.S.) D. G. Nishimura et al.: "Magnetic Resonance Angiography", pp. 140-151, see pp. 147-148, Chapter III B2+O,−O excitation; FIG. 15.

Primary Examiner—Ruth S. Smith
Attorney, Agent, or Firm—Oblon, Spivak, McClelland, Maier & Neustadt

[57] ABSTRACT

The acquisition of images of moving parts by NMR experiments requires the prolonged use of two series of excitation sequences. In the invention, only one sequence is enough. The radiofrequency electromagnetic excitation is itself modified to impose, from the very outset, a piece of information, representing the speed of the concerned moving parts, on the free precession signal. The imaging encodings which follow this particular excitation are standard ones. This particular excitation comprises, in principle, two excitations at 90°, having opposite directions, applied to one and the same axis and separated in time by a period during which a bipolar pulse of a magnetic field gradient is applied. It is shown that the magnetic moments of the fixed particles are re-aligned, at the end, with the orienting field while the magnetic moments of the moving particles are flipped with respect to this orientation, by an angle proportionate to their speed.

2 Claims, 5 Drawing Sheets

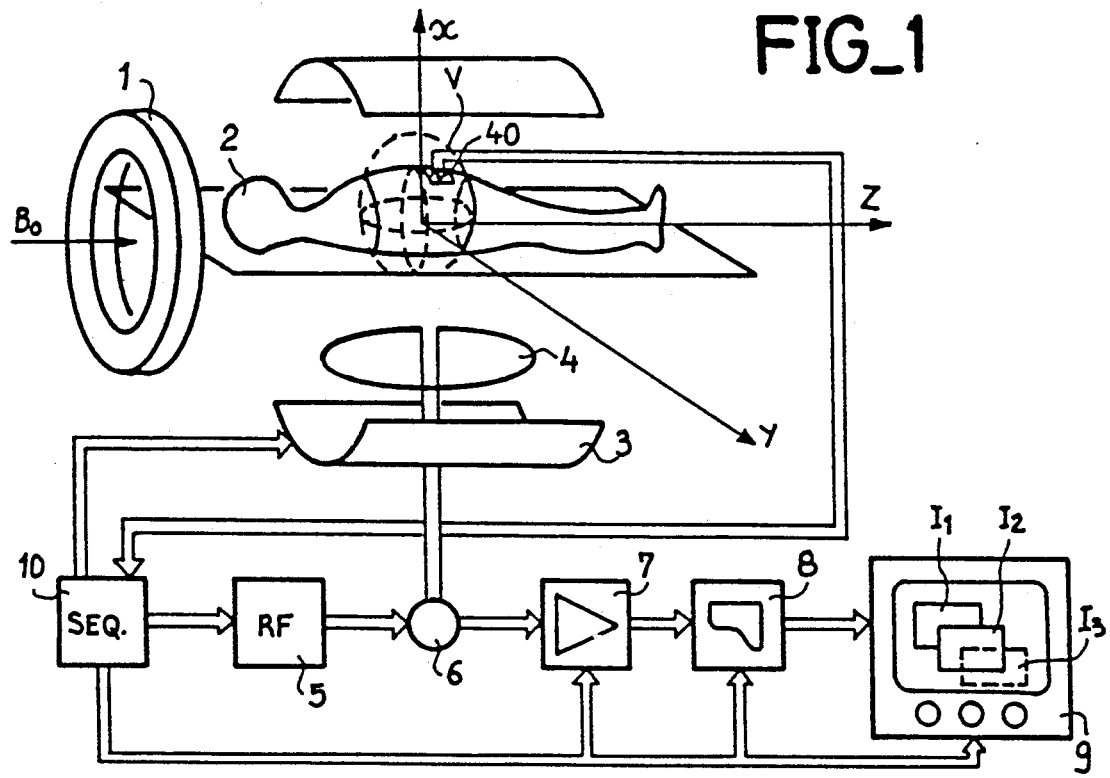
FIG_1
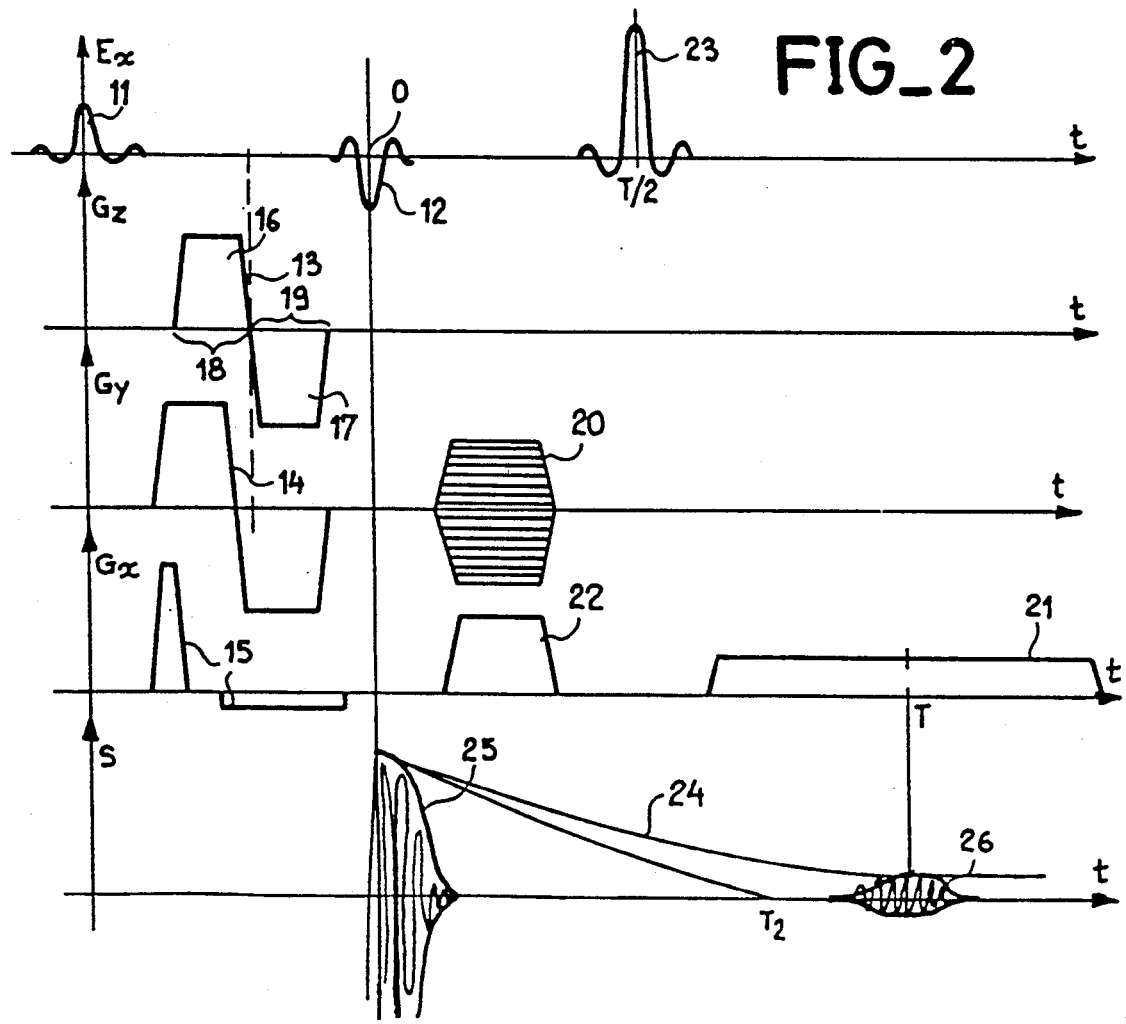
FIG_2

FIG_3_a
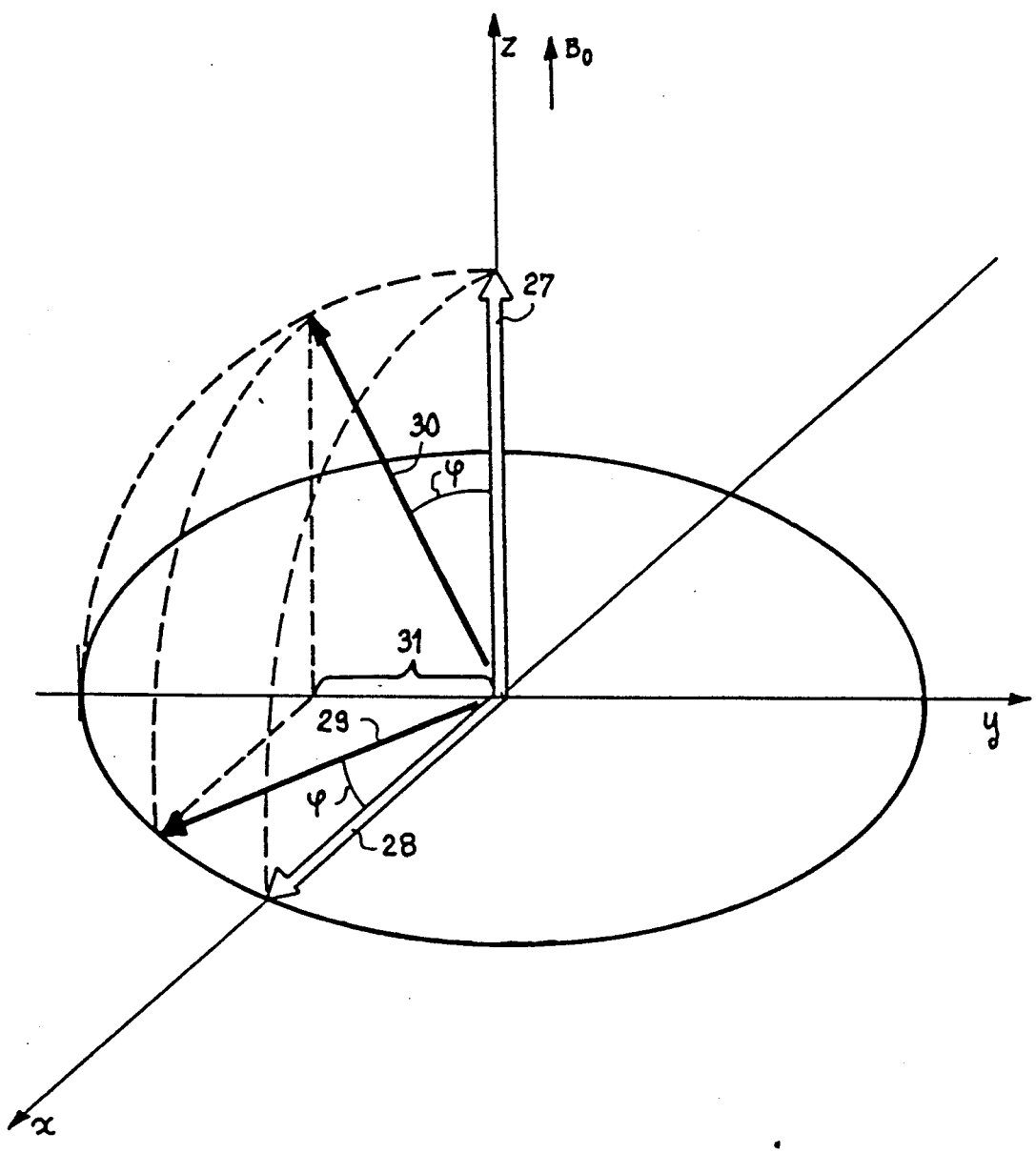

FIG_3-b
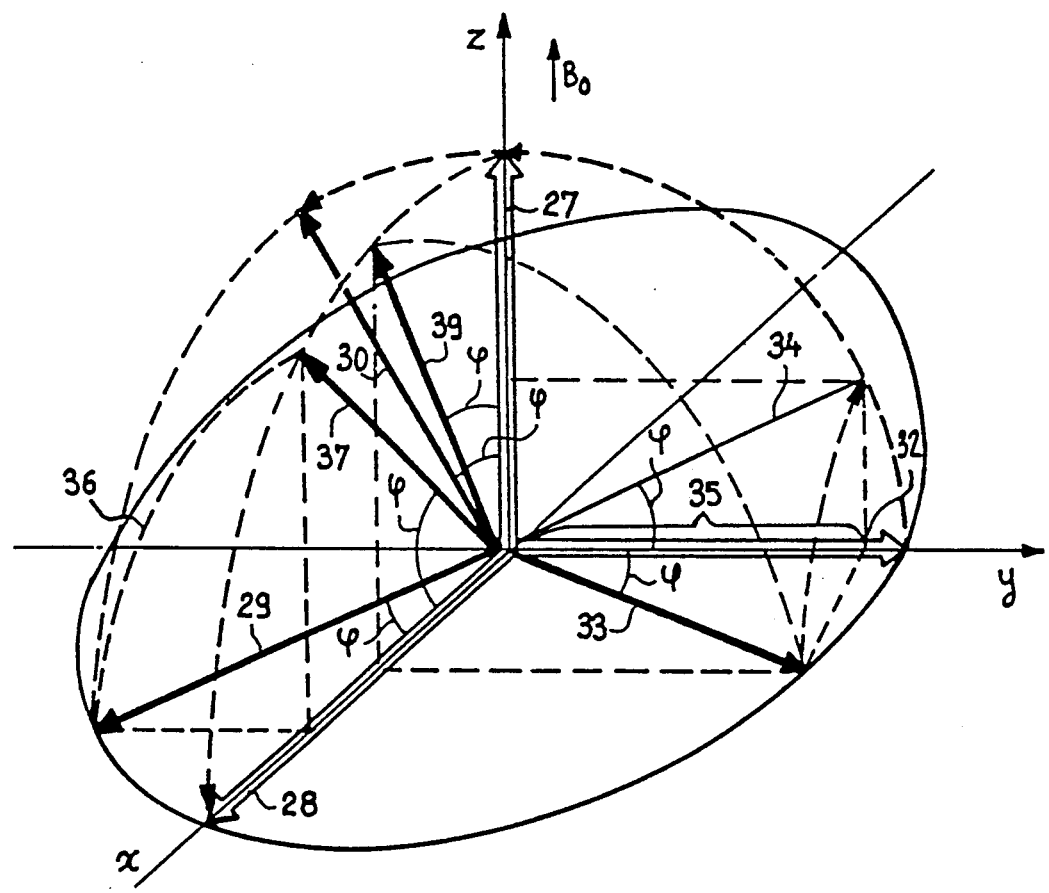
FIG_4
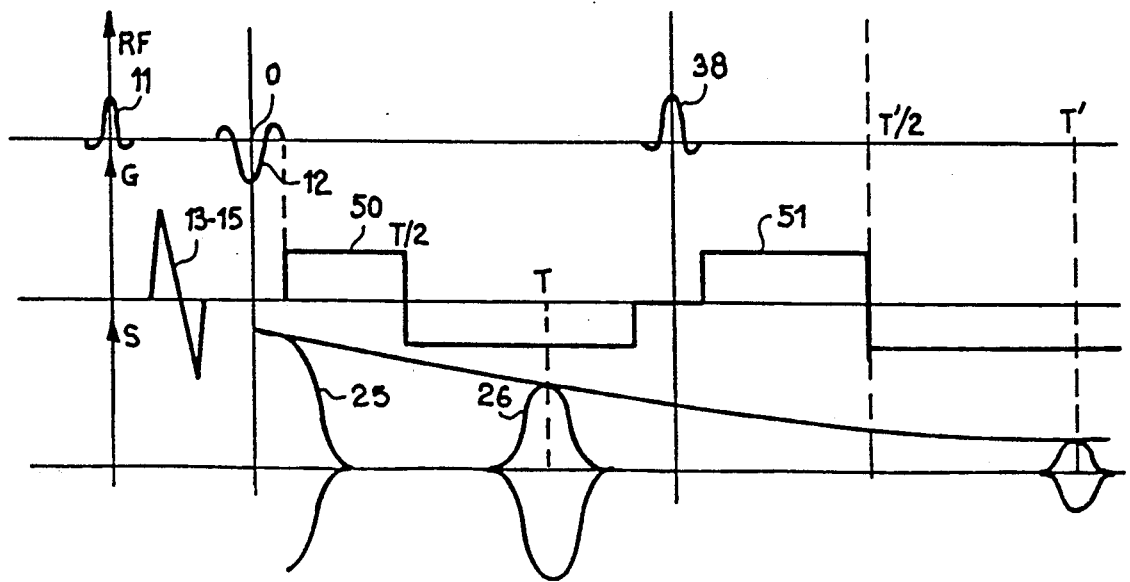

FIG_3-c
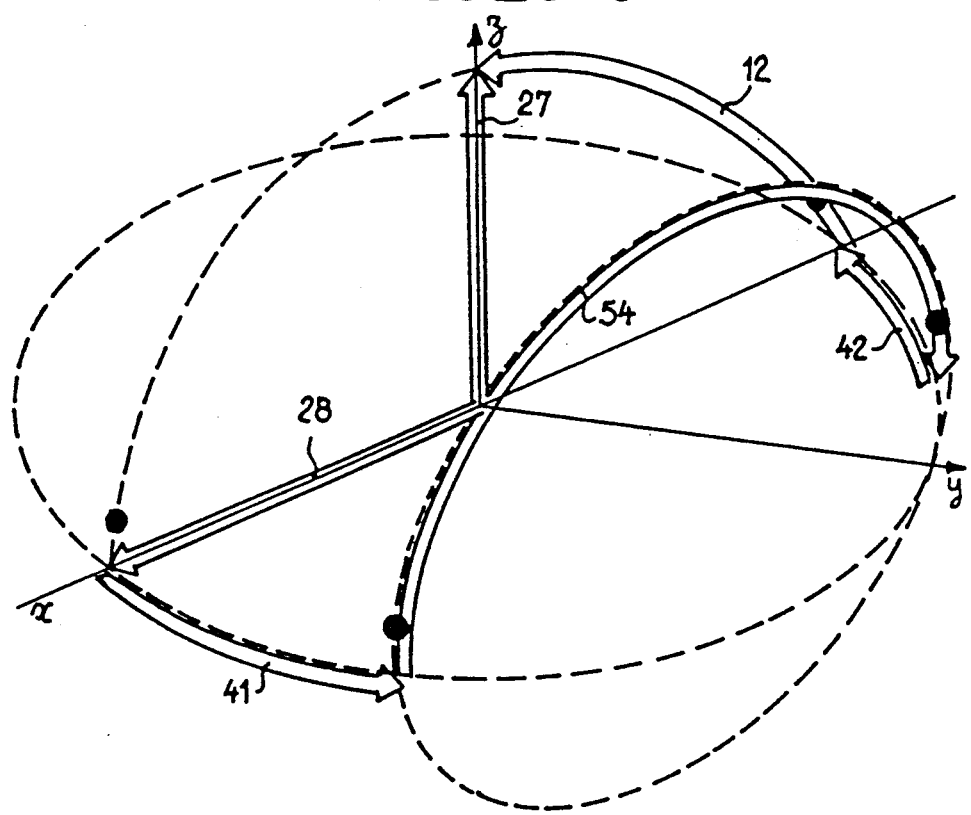
FIG_3-d
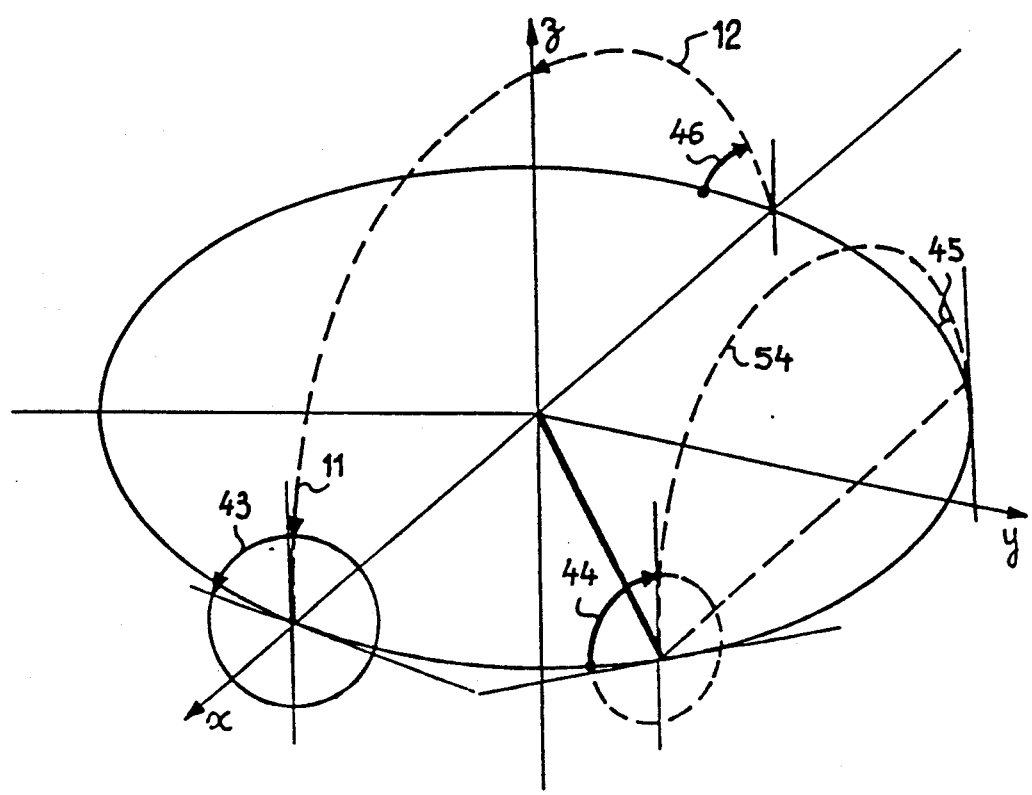

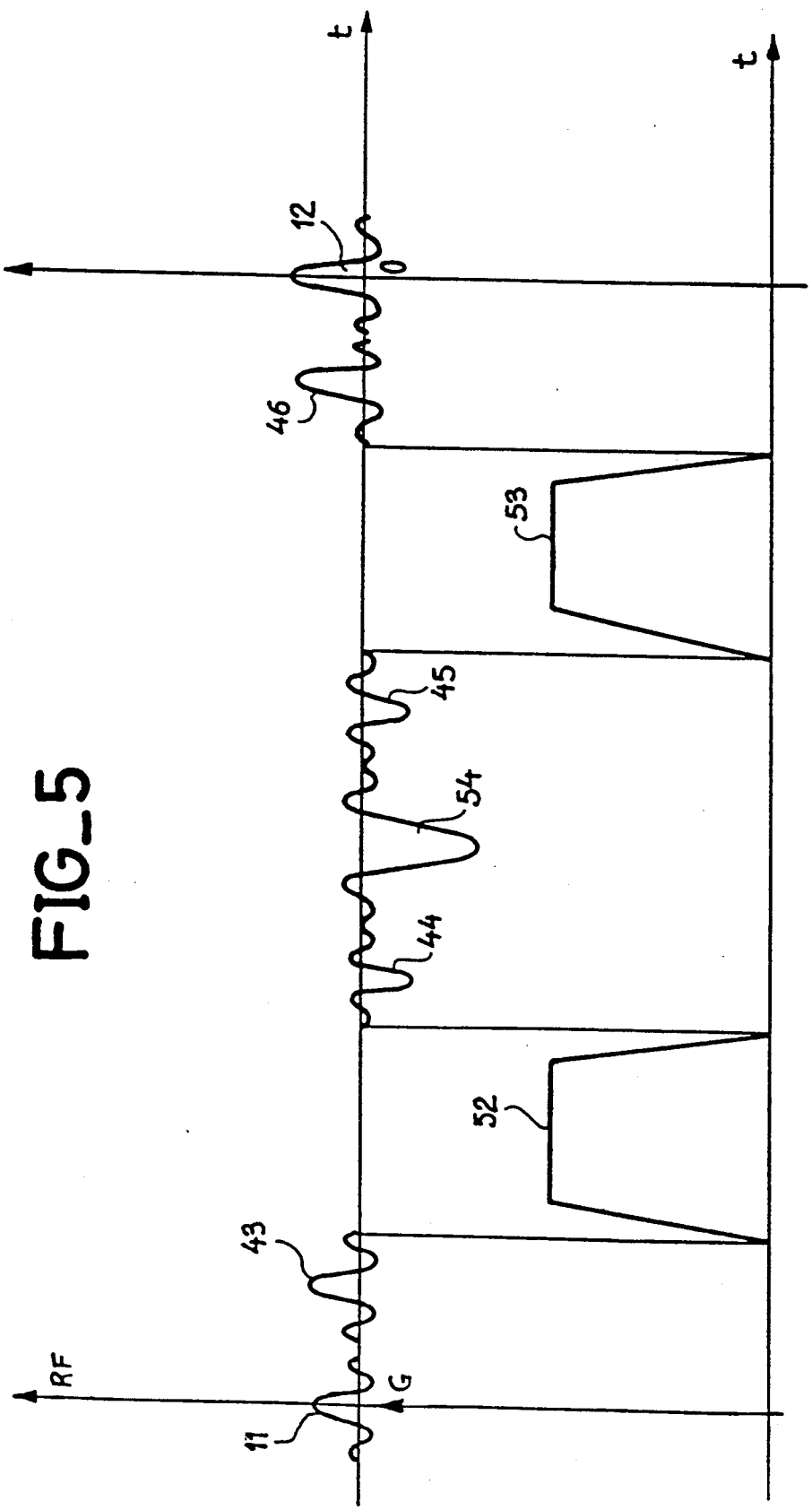

METHOD FOR DEPICTION OF MOVING PARTS IN A BODY BY NUCLEAR MAGNETIC RESONANCE EXPERIMENT

BACKGROUND OF THE INVENTION

1. Field of the Invention

An object of the present is a method to depict moving parts in a body using a nuclear magnetic resonance (NMR) imaging method. The invention can be applied especially in medicine, where the bodies examined are human bodies and where the moving parts may be blood cells flowing in the veins or arteries, or moving organs such as heart muscle. In particular, this invention can be used for angiographic analysis. In this way, it becomes possible to plot the vascular system of a body.

2. Description of the Prior Art

There are known prior art methods, especially as described in the European patent No. 84 307746.2, filed on 19th November 1984, for depicting the images of the moving parts of a body by performing two successive experiments. In a first series of experiments, the image of a section of the body is acquired in a standard way. It is known that the image of the moving parts of the body is not revealed because the contributions provided by these moving parts to the NMR signal are uniformly distributed in phase: these contributions cancel one another out. It has been shown that the cancellation of these contributions is related to the very shape of the magnetic encoding undergone by the parts to be imaged during an imaging sequence. By using so called compensating bipolar pulses to compensate for the unwanted effect of these encodings on the moving parts, it is possible to obtain, in a second series of experiments, an image that reveals both the fixed and the moving parts of the body. By subtracting the standard image from the image obtained with compensation, it is then possible to obtain the image of the moving parts only.

While this method is an effective one, it has one drawback: it is lengthy. For the acquisition of the image of the moving particles calls for the acquisition of two images: the compensated image and the speed encoded image. Now, in NMR, the acquisition of an image is a lengthy process. For the imaging methods used take into account the fact that the response restituted by the body, at each excitation that it undergoes, is a response in volume: at the end, all the particles emit a de-excitation signal. It becomes necessary then to repeat the experiments in series of excitation sequences during which the encoding varies from one sequence to another so as to enable the decoding of the image. Since the return to equilibrium of the magnetic moments of the particles excited during excitation is relatively slow, one sequence can begin after another sequence only after a period of time during which it may be assumed that this equilibrium is re-established. The precision of the images is directly related to the number of sequences in a series of sequences. Usually, the duration needed to acquire an image is about 8 minutes. Thus, an angiographic operation lasts about 16 minutes.

An object of the present invention is to remove this drawback by proposing an image of moving parts which can be acquired in half this time. In the invention, it has been seen to it that, instead of compensating for and encoding the effect of the moving particles during the sequence, the radiofrequency excitation of these particles is sensitized before the acquisition/reconstruction process so that only moving particles contribute to a measurable NMR signal. The fixed parts have their magnetic moments reset and realigned with the orienting, homogeneous, constant, magnetic field of the machine. Other advantages result from this. In the phase encoding sequences within the sequence, the contrast in flow is obtained only after the entire acquisition/reconstruction process. Thus any errors, especially phase errors in the NMR signal, due to eddy currents in the coils used to apply the encodings, are included in it. In the invention, the errors in the processing to reconstruct the image are reduced because only one image is computed. Finally, the image can be sharper.

SUMMARY OF THE INVENTION

The present invention relates to a method for depicting moving parts in a body by a nuclear magnetic resonance experiment, a method wherein, a part of the body is subjected, firstly, to an orienting magnetic field and, secondly, to several excitation sequences during each of which:

the orientation of the magnetic moments of the body's particles is made to flip by means of a first radio-frequency electromagnetic excitation, field gradient pulses are applied to induce, in the signal resulting from the free precession of the magnetic moments, encodings capable of discriminating between the contributions of each part of the body, this free precession signal is picked up, and it is processed to represent the moving parts of the body, wherein, during each first electromagnetic excitation, two successive excitation pulses are applied to make the orientation of the magnetic moments of moving parts flip, by two equal and mutually opposite angles, with respect to the initial orientation of these moments, and wherein, between these two successive excitation pulses, a bipolar pulse of a field gradient is applied.

BRIEF DESCRIPTION OF THE DRAWINGS

The invention will be better understood from the following description and the accompanying figures.

These figures are given purely by way of indication and in no way restrict the scope of the invention. Of these figures:

FIG. 1 shows a schematic view of an NMR machine for implementing the method of the invention;

FIG. 2 shows timing diagrams of signals used in the method of the invention;

FIGS. 3a to 3d show vector diagrams of flipping motions undergone by the magnetic moments excited by means of the method of the invention;

FIG. 4 shows a complex excitation according to the invention to show two images that reveal, firstly, the moving parts and, secondly, the fixed parts;

FIG. 5 shows an alternative, preferred excitation according to the invention.

DESCRIPTION OF PREFERRED EMBODIMENTS

FIG. 1 shows an NMR machine which can be used to implement the method of the invention. This machine comprises mainly means 1 to subject a body 2 to a magnetic, continuous, homogeneous, intense, so-called orienting field $B_0$. Through gradient coils 3, the body 2 can be temporarily subjected to additional magnetic fields, known as field gradients, which can be used in a known way with imaging methods. Thus, in a series of excitation sequences the body is subjected to radiofrequency elecromagnetic excitations applied by an antenna 4 and produced by a generator 5. When the excitations stop, the antenna 4 can be used to measure the de-excitation signal. This de-excitation signal, which is also called an NMR signal, is conveyed by a duplexer 6 to receiving means 7 and, subsequently, to processing means 8 so as to depict the desired images of the parts of the body on a display device 9. All these elements are guided by a sequencer 10. In the prior art, an image $I_3$ of the moving parts of the body was obtained by comparing a first image $I_1$, obtained in a standard way, with an image corresponding in every point to the same parts of the body, and in which the effect of the speed of the moving parts was compensated for.

In the invention, the approach is different because, firstly, it is not necessary to acquire two images and secondly, the excitation is a particular one.

FIG. 2 shows the timing diagrams of an excitation according to the invention. Each of these diagrams has two parts: an earlier part at an instant 0 and a later part. The earlier part relates to the present invention while the later part relates to an imaging method. This may be any method: in a preferred example, the imaging method is known, and is of the 2DFT type. According to this method, an image can be reconstructed through double processing by a Fourier transform of the NMR signal whence its name. The excitation according to the invention essentially has at least two pulses 11 and 12, of a substantially equal absolute value, the effect of which is to cause flipping (in reverse for these two pulses with respect to each other) of the orientation of the magnetic moments of the excited particles. Between these two pulses, the body is also subjected to a bipolar pulse, for example 13 or 14 or 15, of a field gradient. A bipolar pulse of a field gradient is a pulse for which the integral of the value for its duration is zero. This means, for example, that the pulse 13 preferably has two pulses 16 and 17, placed symmetrically from each other with respect to an instant between the two electromagnetic pulses 11 and 12, with equal durations 18 and 19 and with amplitudes that are symmetrical with each other. However (pulse 14) the instant at which the bipolar gradient pulse is reversed does not have to occur in the middle of the duration between the pulses 11 and 12. Similarly (pulse 15) the shapes and durations of the pulses are not necessarily symmetrical. What is important is that the integrals of each of the two gradient pulses forming the bipolar pulse should be equal and should have opposite signs. The gradient pulse may, of course, consist of any combination of the bipolar pulses 13 to 15.

The duration of the phases shown in the left-hand and right-hand parts of FIG. 2 should be compared. Given the rising time (usually about 1 ms) of the electrical supplies commonly used to apply gradient bipolar pulses to the coils 3, the duration between the pulse 11 and the pulse 12 may be about 4 to 10 ms. By contrast, since an NMR experiment measures the relaxation time $T_1$ or $T_2$ of the excited particles, experimenting periods T with neighbouring values are used. In practice, T is about 15 ms to 100 ms and, in this case, the sequences of one series of sequences succeed one another with a repetition time of about 1 second. The right-hand part of the figure shows the encoding gradients applicable to a 2DFT type of imaging method. The image obtained here has the specific feature of representing the projection, on a plane perpendicular to $B_0$ in this example, of the image of all the parts of the body 2 located at the intersection with the volume V covered by the machine. However, the projection can be done in any direction. It shall be shown further below that the method of the invention can also be applied to the making of images of sections of the body 2 which are usefully subjected to examination. In a known way, the imaging sequence comprises essentially two gradient pulses of different natures, a phase-encoding pulse 20 and a read-encoding pulse 21 applied on two axes, x and y respectively, which are orthogonal to the machine and in the plane of which the image is shown. The pulse 20 has the specific feature of having a value which changes between one sequence and another during the series of sequences. The read pulse 21 is associated, in a known way, with a read pre-coding pulse 22. A radiofrequency electromagnetic pulse 23, applied at an instant T/2, is aimed at getting rid of the non-homogeneities of the field $B_0$. It causes the reflection of the phase dispersal of the NMR signal, due to these non-homogeneities. Consequently, the NMR signal, which has to follow a theoretical curve 24 and which actually fades away quickly (at 25) because of these non-homogeneities, reappears temporarily at an instant T (at 26) the value of which is twice the instant T/2 at which the pulse 23 is applied, the said pulse being therefore called a spin echo pulse.

FIGS. 3a to 3d give a schematic view of the flipping of the orientation of the magnetic moments subjected to an excitation according to the invention. In a preferred way, the flipping angle is equal to 90°. Thus, during the first electromagnetic pulse 11, a magnetic moment 27, oriented in a direction parallel to $B_0$, along an axis z, is suddenly oriented at 28 along an axis x, after a rotation of 90° about an axis y. As soon as it is in this position, the magnetic moment 28 starts precessing. FIGS. 3a to 3d are shown in the rotating reference related to this magnetic moment and depending on this precessional motion. This means that, during this precession, the magnetic moment 28 is only set upright again. In the invention, very quickly before this resetting motion becomes appreciable, the gradient bipolar is applied. Because of this pulse, the magnetic moments of the moving parts are phase shifted, for example at 29, with respect to the orientation of the magnetic moments of the fixed parts. The value Φ of this phase shift is proportionate to the speed of the concerned moving parts v and to a factor k depending on the integral of each of the two bipolar gradient pulses. The value Φ is related to the direction of the concerned moving parts with respect to the gradient axis chosen to apply the bipolar pulse.

This phase shift can be explained as follows. For the fixed parts, during the first bipolar gradient pulse, the precession speed is accelerated (or slowed down, depending on the direction of the pulse) while, during the second pulse it is slowed down (or accelerated) in an equal way. In other words, the magnetic moments of the fixed particles are phase-shifted with respect to the moving reference and then return to phase with this reference. As regards the moving particles, during the second bipolar gradient pulse, the compensation of the phase shift due to the first pulse does not occur. For these particles, owing to their motion related to their speed, are in other regions of space during this other duration, where the encoding conditions, related to the gradient, are different.

Thus by reapplying an excitation that tends to reset the magnetic moments at the end of the gradient bipolar pulses, the following situation is achieved: the magnetic moments of the fixed particles are realigned with the field $B_0$ while the magnetic moments 30 of the moving particles make an angle $\Phi$ with the direction of the orienting field. The components 29 become flipped into components 30. The result of this is that the moving particles then contribute alone to the NMR signal, with a value 31 proportionate to $\sigma_v \sin \Phi = \sigma_v \sin k.v$. The value $\sigma_v$ represents the density of the particles driven by the speed v in each of the elementary regions or voxels of the body 2, subsequently represented by a point or pixel of the image. It is enough then, to use any imaging method to obtain an image by using the signal 31 as the NMR signal. Consequently, in each sequence of a series of sequences needed to acquire an image, the excitation will comprise two flipping pulses which neutralise each other as regards the fixed particles.

FIG. 3b gives the possible form of the orientation of the magnetic moments depending on the nature of the axis on which the second excitation, relating to the return to equilibrium of the fixed parts, takes place. After the first pulse, the moments 27 are again at 28 and at 28 and 29 after the application of the bipolar gradient. Instead of causing a reverse flipping at the instant when the rotating reference passes through a preferred position with respect to the antenna (the same instant as the instant of the first excitation as in the example of FIG. 3a), it is possible to choose an orientation shifted by 90°, i.e. actually delayed in time by a quarter of the duration of a period of the precession signal. The components 28 and 29 are then respectively in 32 and 33 at the instant of the second excitation. The reverse flipping then brings them respectively to 32 and 34. The overall NMR signal then consists of all these components 32 and 34. The component 34 plays a role in the NMR signal in proportion to its projection 35 in the plane xy. This projection 35 is equal to $\sigma_v \cos \Phi = \sigma_v \cos k.v$. If we recall that the component 32 corresponds to fixed particles, hence to v nil, it is possible to write that the NMR signal after these two excitations is composed of contributions in each voxel proportionate to $\sigma_v \cos k.v$.

It is also possible to obtain a signal in $\sigma_v \cos k.v$ by converting the reverse flipping around the axis y into a corresponding flipping around an axis x. For the component 29 can be reset by a rotation 36 of 90° about the axis x. The component 29 is then carried to 37 and the signal then consists of the components 28 as regards the fixed parts and the component 37 as regards the moving parts. It also consists, on the whole, of contributions in each voxel in $\sigma_v \cos k v$. In a dual way, it has been shown in FIG. 3b that a component 39 can also be obtained by a flipping of the component 33 about the axis The result of this presentation is that the flippings, to cause the excitation of the invention, can be produced in any planes. They can also be applied, with respect to the original phase (component 28), in phase (29 towards 30 or 29 towards 37), in phase quadrature (33 towards 34 or 33 towards 39) or, again, in any phase. The planes and phases, however, should be connected so as to work together for the desired result.

To make simple angiographic analyses, it is preferred to eliminate the relative contributions of the fixed parts from the signal: the $\sigma_v \sin k.v$ approach is chosen. However, it is possible to use a more complex excitation, schematically shown in FIG. 4. In a first phase, the two excitation pulses 11 and 12 are respectively applied before and after the gradient bipolar pulse 13–15. The excitation according to the invention, in this case, is preferably such that the NMR signal is proportionate to $\sigma_v \sin k.v$. During the imaging part of the sequence which follows this excitation, rather than using the technique with the spin echo which is relatively lengthy and which destroys longitudinal magnetization, it is preferable to use a so-called echo gradient approach. According to this known technique, the read gradient 50 is applied at the end of the excitation. At the reading stage it suddenly changes its value at an instant T/2 just between the excitation instant and the read instant T. It is known that this gradient echo has the same result on the reflection of the phase dispersal if the non-homogeneities of the field $B_0$ are not excessive. The signal is therefore revived at 26 where it is measured.

At the end of the measurement around the instant T, it is possible to apply a third radiofrequency pulse 38, on a chosen axis, so as to recover, with the moving parts alone, contributions proportionate in each voxel to $\sigma_v \cos k.v$. In FIG. 3b, for example, the pulses 11 and 12 have the effect of positioning the fixed and moving components, respectively, at 27 and 30. During the sequence with the echo gradient, the NMR signal thus formed is measured. It represents the moving parts. Since this measuring sequence may be short, it may be considered that, at its end, at the instant of the pulse 38, the component 30 has retained a substantial and measurable value. With pulse 38, the components are then made to rotate about the axis x, by suitably synchronising the instant at which this third electromagnetic pulse is applied so as to place them respectively in 34 and 32. Thus the NMR signal is now no longer proportionate except with $\sigma_v \cos k.v$. This D signal can then be subjected, for a period T', to an imaging encoding with a desired imaging method and with compensation for the non-homogeneities of $B_0$ of the gradient echo (T'/2, 51) type or with spin echo.

The value of this technique lies in the following features. Firstly the signal can be acquired in two different ways, in sine and cosine, and it is therefore possible to make two images and, secondly, this acquisition is done during one and the same series of sequences: it does not last for twice the time. Furthermore, by comparing the two acquired images in this way, it is possible to deduct two other images: a first image in pure speed v and a second image in pure density $\sigma$. This discrimination is possible since there are two images available for which the data at each point respectively represent $\sigma_v \sin k. v$ and $\sigma_v \cos kv$ where $\sigma_v$ and v are mean densities and speeds in the voxel corresponding to this point. The problem thus raised can be resolved mathematically. In practice, the complex excitation corresponding to FIG. 4 is more especially suited to the depiction of cardiac phenomena. Using a detector 40 (FIG. 1) connected to the sequencer 10 of the machine, the application of the electromagnetic excitations is synchronised. It is then possible to choose the instants T and T' in the heart cycle at which the images are depicted. If necessary, it is even possible, since the gradient echo technique is a swift one, to replace the measuring instant T by several instants $T_1, T_2 \ldots$ for which, at each instant, the images of the heart can be depicted. Each of these images at these instants is then compared with these instants with the image at the instant T' so as to discriminate the pure speed image. This technique makes it possible to see turbulence or eddies in the flow of blood in the heart.

It can be shown that, by proceeding in the above-described manner, the phase errors between the sequences of two series of successive sequences no longer occur because there is only one sequence. Similarly, the computing of the images in speed, requiring the use of mathematical algorithms which compute the Fourier transforms, have a "computation noise" related to the precision, in practice related to the number of bits that quantify the signals. By computing the image from a signal that itself represents speed, and for a same number of quantification bits, the adverse effects of these computing noises is avoided. It can also be shown that the eddy currents resulting from the dampening of the electromagnetic excitation in the gradient coils 3 can now be overlooked. However, it is still necessary to cope with the well known non-homogeneities of the orienting field $B_0$ and the non-homogeneities of application of the excitation throughout the volume under examination. For it can be shown that, despite the speed of the excitation thus designed (about 4 ms), the non-homogeneities of the field $B_0$ can eliminate the NMR signals. For, in an example where the field $B_0$ is equal to 0.5 Tesla and where the precession frequency is equal to about 20 Mhz, a non-homogeneity of 50 parts to a million can result in a phase shift (for protons of the same nature) equal to four rotations, namely $8\pi$ radians. Consequently, in a preferred way, the excitation will have the general form shown in FIG. 5, i.e. it will comprise a 90° excitation 11 and a 90° pulse 12 positioned symmetrically in time on either side of a spin echo pulse 54. Owing to the presence of this spin echo excitation, the gradient bipolar pulses (52 and 53) should be oriented in the same direction. This spin echo pulse modifies the direction of their effect with respect to the magnetic moments (this therefore gives a wider meaning to the expression "bipolar").

However, the 90° and 180° excitations are not always perfect. They are sometimes poorly calibrated and, above all, they are not homogeneous. FIG. 3c shows how, in a preferred way, this difficulty can be coped with by using the spin echo excitation 54. After the excitation 11, the magnetic moments 27 are oriented at 28. Owing to the non-homogeneity of the field $B_0$, at the end of a certain period, these magnetic moments are distributed along an angle sector 41 (FIG. 3c). The spin echo excitation 54 flips these magnetic moments, distributed along 41, into magnetic moments distributed along a sector 42. The arrow 54 of FIG. 3c shows the flipping corresponding to the spin echo operation. Owing to the presence of the spin echo, the second 90° pulse 12 has the same direction as the original pulse. In this way, at the instant when this spin echo is applied, the magnetic moments of the fixed parts are brought to 27. Dots have been used to depict the ends of the directions of vectors representing the magnetic moments of particles which have not flipped exactly by 90° owing to a poor calibration of the pulse 11. They correspond, for example, to flippings at an angle of less than 90°. It can be realized, at this stage, that it is worthwhile to orient the spin echo excitation pulse which, for the same reasons should also have the same calibration error, although double in this case, in a direction opposite to the flipping pulse 11. In this way, the faults of the pulses 11 and 12 are compensated for by double faults, but faults in the opposite direction of the single pulse 54. For the spin echo could have been provoked by a rotation around y in the same direction as the initial rotation. This drawing shows that it is preferable to have a pulse around the axis y in the reverse direction. The errors cancel each other-out. A pulse in the reverse direction is marked Y to indicate its direction with respect to a conventional direction, for example the trigonometrical direction. It is observed that the pulse 11 and the pulse 12 have the same conventional direction but may be considered to have opposite directions with respect to the magnetic material because of the presence of the spin echo excitation.

Finally, as an improvement, each pulse 11, 12 and 54 can be replaced by a composite pulse tending to reduce the non-homogeneities of the excitation. For a non-homogeneous excitation does not make all the protons of the volume covered flip in the same way. It is possible (and FIG. 3d supports the explanation of this point) to replace a non-homogeneous excitation by a so-called composite pair of two successive excitations oriented along axes that differ from the orientation of the magnetic moments. Thus the flipping 11 around the axis y can be followed by a flipping in a conventional trigonometrical direction 43 around the axis x. The spin echo pulse 54 is itself replaced by a composite combination of a pulse 44 around the axis x (but in the reverse direction to the conventional one), the pulse 54 around the axis y (as above) and a pulse 45 also around the axis x (but also in the reverse direction to the conventional one). The pulse 12 is itself replaced by the sequence of the pulse rotating in the conventional direction 46, around the axis x, and by the pulse 12 itself. FIG. 5 recalls all these pulses by depicting their directions. When positive, the pulses are in the conventional direction. When negative, they are in the reverse direction. It can be shown that, by acting in this way, the effect of the non-homogeneity of the excitation is neutralized.

What is claimed is:

1. A method for depicting, in an image, moving parts in a body by nuclear magnetic resonance experiment comprising the steps of:

subjecting a part of said body firstly, to an orienting magnetic field and, secondly, while maintaining said orienting field, subjecting said part to several excitation sequences each of which includes, a first main step followed by a second main step, itself followed by a period of time during which it may be assumed that the equilibrium of magnetic moments is re-established.

said first main step including:

flipping an initial orientation of magnetic moments of said body by means of a first radiofrequency electromagnetic excitation comprising two successive excitation pulses, applying said two successive pulses to make said orientation of said magnetic moments of said body flip by two equal and mutually opposite flipping angles, with respect to said initial orientation of said moments, applying a bipolar field gradient pulse between said two successive excitation pulses, applying first field gradient pulses after said excitation to induce, in a first free precession signal resulting from a free precession of said magnetic moments, first dephasings for discriminating contributions of each part of the body, said first field gradient pulses including a gradient echo type pulse, measuring and processing said first free precession signal, to represent said moving parts of the body, said second main step beginning, after the first free precession signal is measured, said second main step includes the body being subjected to a second radiofrequency excitation to again cause the flipping with a flipping angle of the magnetic moments, applying second field gradient pulses after said second excitation to induce, in a second free precession signal resulting from said free precession of magnetic moments, dephasing for discriminating contributions of each part of the body, measuring and processing said second free precession signal, to also represent moving parts of the body, and further processing together the first and second processed free precession signal in order to depict a pure speed or a pure density image.

2. A method according to claim 1, wherein said flipping angles are substantially equal to 90° in terms of absolute value.

* * * * *